(12) United States Patent
Kalnischkies (10) Patent No.: US 11,041,918 B2
(45) Date of Patent: Jun. 22, 2021

(54) MAGNETIC RESONANCE DEVICE AND METHOD FOR OPERATING A MAGNETIC RESONANCE DEVICE

(71) Applicant: Siemens Healthcare GmbH, Erlangen (DE)

(72) Inventor: Bernd Kalnischkies, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/546,285

(22) Filed: Aug. 20, 2019

(65) Prior Publication Data

US 2020/0064420 A1  Feb. 27, 2020

(30) Foreign Application Priority Data

Aug. 21, 2018  (DE) ..................... 10 2018 214 115.0

(51) Int. Cl.
*G01R 33/24* (2006.01)
*G01R 33/54* (2006.01)
*G05B 19/042* (2006.01)

(52) U.S. Cl.
CPC ............. *G01R 33/24* (2013.01); *G01R 33/54* (2013.01); *G05B 19/0423* (2013.01)

(58) Field of Classification Search
CPC ...... G01R 33/24; G01R 33/54; G01R 33/543; G01R 33/28; G01R 33/32; G05B 19/0423
See application file for complete search history.

(56) References Cited

U.S. PATENT DOCUMENTS 5,842,037 A * 11/1998 Haartsen ........... H04W 52/0287
710/1
6,198,287 B1  3/2001 Heiserholt
(Continued)

FOREIGN PATENT DOCUMENTS

DE  19732120 A1  12/1998
DE  19722221 C2  10/1999
EP  1555841 A1 *  7/2005 ............ H04W 88/06

OTHER PUBLICATIONS

ISO "ISO 11898-5: Road vehicles—Controller area network (CAN)" Part 5: High-speed medium access unit with low-power mode; First edition, Jun. 15, 2007. pp. 1-26.
(Continued)

*Primary Examiner* — Susan S Lee
(74) *Attorney, Agent, or Firm* — Lempia Summerfield Katz LLC (57) ABSTRACT

At least one first component is operable in a sleep operating mode avoiding electromagnetic interference signals. A first component in the sleep operating mode is placed at least temporarily into the normal operating mode upon receiving a communication message via a bus system. The first and second components along at least one communication pathway are each arranged such that all first components are provided at an end of the communication pathway distant from a master component as a bus segment connected directly downstream of at least one of the second components and containing exclusively first components. At least the second component of each communication pathway that is provided directly adjacent to the bus segment in the communication pathway has a switch for temporarily blocking the communication forwarding on the communication line of the line connection assigned to the bus segment and a controller for actuating the switch.

17 Claims, 3 Drawing Sheets

(56) References Cited

U.S. PATENT DOCUMENTS

| | | | |
|---|---|---|---|
| 7,046,005 B2 | 5/2006 | Watkins | |
| 2011/0210739 A1* | 9/2011 | Ham | G01R 33/28 |
| | | | 324/318 |
| 2016/0163047 A1* | 6/2016 | Oh | G01R 33/34 |
| | | | 382/131 |

OTHER PUBLICATIONS

Vision Systems "Serial to RS422/485 Converter SER-485(ISO) User Manual" Edition: Jun. 2016; URL: http://ftp.vscom.de/multiio/others/info/Ser-485_Manual.pdf—pp. 1-23.

* cited by examiner

| Legend | |
|---|---|
| 1 | magnetic resonance device |
| 2, 2a, 2b | communication pathways |
| 3 | master component |
| 4 | second components |
| 5 | first components |
| 6 | bus segment (sleeping segment) |
| 7 | bus segment (awake segment) |
| 8 | switch unit |
| 9 | control unit |

FIG 3

MAGNETIC RESONANCE DEVICE AND METHOD FOR OPERATING A MAGNETIC RESONANCE DEVICE

This application claims the benefit of DE 10 2018 214 115.0, filed on Aug. 21, 2018, which is hereby incorporated by reference in its entirety.

BACKGROUND

The present embodiments relate to a magnetic resonance device and a method for operating such a magnetic resonance device.

Magnetic resonance devices are already widely known in the prior art and are often used for medical imaging. For recording magnetic resonance data, extremely weak magnetic resonance signals are received by high-frequency coil arrangements of the magnetic resonance device and subsequently processed. For this reason, the image recording operation is extremely sensitive to such interference signals as may emanate from other components of the magnetic resonance device and ancillary devices. If, for example, there are free-running clock signals from processors of components located in the vicinity of the receiving facility of the magnetic resonance device, these may cause an interference with the image recording operation. This may manifest as artifacts (e.g., streaks or dots) in the magnetic resonance images produced.

To avoid such problems, it is known to place such components, which may interfere with the image recording operation, into a sleep operating mode at least during the interference period. In the sleep operating mode, suitable operating parameters are selected on the component side in order to suppress the emission of interference signals. The measures taken as a result of the change to the operating parameters may include, for example, the deactivation of a clock generator or the like. If it is not possible to switch into a sleep operating mode free from interference or with reduced interference, a generally time-consuming and expensive shielding measure is to be implemented in order to provide an interference-free image recording operation.

For communication in magnetic resonance systems, serial bus systems are often used, which have at least one master component from which extends at least one communication pathway of the bus system to which the remaining components that are to communicate in the serial bus system are connected. Concerning the components referred to in the following as first components, which may cause a potential interference with the image recording operation and are operable in a sleep operating mode and in a normal operating mode, the implementation for "waking up" from the sleep operating mode may be a two-stage process. A physical waking up takes place first by any communication message being sent via the serial bus system. As a result of this bus activity alone, the first component that is in the sleep operating mode is placed at least temporarily into the normal operating mode (e.g., by a deactivated clock generator being reactivated). Because the communication message resulting in the "waking up" is not yet understood by the first component at this point in time, a logical waking up takes place in a second process act by a special further communication message (e.g., a wake-up signal) being sent via the serial bus system to the first components, placing the first components permanently in the logical awake state (e.g., the normal operating mode). If the wake-up signal is not received or is not received in good time, the first component falls back into the sleep operating mode after a predefined time span.

If a shared serial bus system is used for both sleeping components and components that are always awake (e.g., second components), then the first components in the sleep operating mode are placed briefly into the normal operating mode by any bus activity of the second components that are permanently in the normal operating mode. Although the first components usually fall automatically back into the sleep operating mode after the time span, even the brief time in the normal operating mode may be sufficient for interferences to be emitted and to influence the image recording operation, even culminating in the entire magnetic resonance scan being unusable.

It has therefore been proposed in the prior art to use a different serial bus, to which the components are connected, for the first components and the second components in each case. This, however, results in additional cost and effort (e.g., due to additional hardware, such as cables, plug connectors, or the like).

SUMMARY AND DESCRIPTION

The scope of the present invention is defined solely by the appended claims and is not affected to any degree by the statements within this summary.

The present embodiments may obviate one or more of the drawbacks or limitations in the related art. For example, an easy-to-implement, cost-effective implementation of the communication between components of the magnetic resonance device via a serial bus system including first components that have the potential to cause interference as well as second components that do not correspond to the first components.

In one embodiment, a magnetic resonance device includes components along at least one communication pathway that are each arranged such that all first components are provided at an end of the communication pathway distant from a master component as a bus segment connected directly downstream of at least one second component and containing exclusively first components. At least the second component of each communication pathway that is provided directly adjacent to the bus segment in the communication pathway has a switch unit for a communication line of the line connection assigned at least to the communication direction toward the bus segment and a control unit. The control unit is embodied to cause the switch unit to suppress the communication forwarding to the bus segment upon receiving an active blocking signal indicating an active sleep operating mode of the first component, and to cause the switch unit to release the communication forwarding to the bus segment upon receiving a release signal.

In the context of the present embodiments, a shared, serial bus system is provided for both the first components and the second components. The serial bus system has at least one communication pathway extending from a master component that may act as the master with regard to the communication in the serial bus system. Given that the first components in the sleep operating mode are embodied to be placed at least temporarily into the normal operating mode upon receiving any communication message via the serial bus system (e.g., to wake up at least for a short time during communication activity), in order nevertheless to avoid interferences to the image recording operation, the arrangement of the components along the at least one communication pathway may be selected such that all first components are provided without second components in a bus segment at the end of the communication pathway distant from the master component. In order to provide that no communication activity wakes the first components up for a short time when the first components are in the sleep operating mode (e.g., therefore during the interference period), at least the second component that is adjacent to the bus segment with the first components may be developed such that a switch unit is added to this second component. The switch unit is able to block the communication forwarding to the bus segment for a communication line of the line connection assigned at least to the communication direction toward the bus segment, as required, so that the physical occurrence of activity on the communication pathway in the bus segment may be prevented. This may be a physical separation of the first components from the second components at the signal level.

At least the second component provided directly adjacent to the bus segment in the communication pathway further has a control unit that is embodied to cause the switch unit to block or release the communication forwarding to the bus segment. To this end, for example, corresponding blocking and release signals may be emitted as communication messages via the serial bus system (e.g., from the master component). The master component itself forms a second component. I If only first components are otherwise provided in a communication pathway extending from the master component, the master component may also act as the second component directly adjacent to the bus segment. The master component may therefore itself have a corresponding switch unit and a correspondingly embodied control unit.

Overall, both first components (e.g., "sleeping components") and second components (e.g., "awake components") may be operated on the same serial bus system by the first components being grouped together into bus segments, which may also be referred to as sleeping segments, and bundled at the ends of the communication pathways. Different topologies of the serial bus system, such as a line topology with a single communication pathway, a star topology with several equally long communication pathways extending from the master component, or also combinations thereof in which originally linear communication pathways are divided further may be provided.

For each communication pathway provided, the second component, which is followed immediately by a bus segment with first components (e.g., sleeping segment), therefore assumes the task of switching at least the communication direction toward the corresponding bus segment.

One or more of the present embodiments therefore provide intervention in the serial bus system at the level of the physical signals in an additional act with regard to the activation or deactivation of the sleep operating mode. Thereby, one or more of the present embodiments provide that the bus segment with the first components is separated physically from the rest of the communication pathway and is no longer impaired by activity on the awake segment of the communication pathway, which includes the second components. A number of advantages are thus achieved.

It is possible to save cost and effort for the implementation of additional serial bus systems for the first components alone. This applies to both the cabling and the master component. In individual cases, a high level of cost and effort may be incurred if expensive substitute solutions are to be implemented solely on account of the necessary separation of sleeping and awake components.

On or more of the present embodiments may be implemented particularly easily, since only minimal modifications are to be made at least to the second components adjacent to the bus segment. A further improvement is achieved by the simplification of the system topology. This makes the solution suitable in principle for all conceivable serial bus systems, including serial bus systems with differential and optical signal transmission.

In one embodiment, the line connection may have two communication lines assigned in each case to a communication direction, with the interruption of the communication forwarding affecting only the direction toward the bus segment. The signal types "Rx" (e.g., send signal) and "Tx" (e.g., receive signal) are used in principle in serial bus systems. For this purpose, there is an outgoing communication line (e.g., for Tx) and a return communication line (e.g., Rx) extending from the master component. While it is generally common for serial buses to use a logic facility in order to divert signals from the communication lines, it is known for serial bus systems with differential signal transmission, such as CAN bus, MOD bus and the like, to use a separate driver module within the component in order to derive non-differential receive signals from the differential receive signal and to generate differential send signals from the non-differential send signals. The generated differential send signals are then transmitted along the corresponding communication line.

An embodiment in which only the communication forwarding toward the bus segment is interrupted, but not the communication line from the bus segment in the direction of the master component, is advantageous in magnetic resonance devices in which at least one part of the first components is embodied to switch from the sleep operating mode into the normal operating mode (e.g., as a result of an external switch signal received outside of the serial bus system and/or an internal switch signal). In other words there is also a second wake-up possibility for the first components, which is initiated by the respective first component itself based on internal or external switch signals. Since this further wake-up possibility is essential for many magnetic resonance devices, this may be retained in one or more of the present embodiments, which is achieved by the blocking of the communication forwarding only in the outward direction, but not in the return direction. In this way, the first components, which have switched into the normal operating mode as a result of the switch signal, which is independent of the serial bus system, are enabled to indicate this change of state (e.g., to the master component).

A corresponding development of the present embodiments therefore provides that the master component is embodied, upon receiving a switch signal from a first component via the uninterrupted communication line indicating a switch to the normal operating mode triggered outside of the serial bus system, to emit a release signal at least when the switch signal fulfills a relevance criterion. Accordingly, a relevance condition may optionally also be verified, for example, if the switch signal contains as a communication message an item of information indicating for what reason or for how long the normal operating mode was activated, so that, for example, if there is no requirement to communicate via the serial bus system or the normal operating mode is activated only for a short time, a release signal may also be suppressed.

The master component may be embodied to generate the blocking signal and the release signal addressed to the second component connected directly upstream of the bus segment. This provides that the corresponding second components may be addressed directly, so that the corresponding communication message (e.g., within the control unit) may be interpreted by the corresponding second component as a measure indicating a requirement.

In an embodiment, a multi-step procedure may be provided with regard to the activation of the sleep operating mode and the normal operating mode of the first components. The master component may be embodied to activate the sleep operating mode for all first components by emitting at least one sleep signal activating the sleep operating mode to all first components followed by the blocking signal and/or to activate the normal operating mode by emitting the release signal followed by at least one wake-up signal activating the normal operating mode to all first components. This provides that, in the case of the sleep operating mode to be activated, the sleep operating mode is initially activated via at least one corresponding communication message, and immediately thereafter, the forwarding of communication signals to the bus segment is suppressed by the blocking signal via the directly adjacent second component. In the reverse case, the first bus segment is initially once again to be reachable for the master component so that initially the release signal is sent, and thereafter, once the communication forwarding to the bus segment has been released, the first components may be placed accordingly back into the normal operating mode.

The waking up of the first components, but also where appropriate, the "sending to sleep", may take place in a two-stage process in the context of the present embodiments. In this way, it may be provided that the control unit is embodied to generate at least one preparation signal as a further sleep signal or wake-up signal in addition to the sleep signal and/or wake-up signal finally activating the respectively desired operating mode. As already mentioned, any communication activity on the serial bus system may result in a brief activation of the normal operating mode on the side of the first components, without, however, the communication activity that led to this being analyzed. A second, actual wake-up signal that is understood by the first components is therefore sent subsequently. With regard to the activation of the sleep operating mode, too, a preparation message (e.g., a preparation signal) may be used initially so that the corresponding first components may prepare for the sleep operating mode (e.g., by storing operating parameters or the like).

In one embodiment, the communication lines are embodied for optical signal transmission. The present embodiments may therefore also be implemented in such an optical, serial bus system, since the components normally use optocouplers for the incoming communication signals from the line connection, including, for example, at least one optical communication line, to convert incoming light signals into electromagnetic signals for processing. A corresponding logic facility, which diverts signals for processing in the component (e.g., via the control unit) may also be used to implement the switch unit, which then, for example, suppresses the actuation of the corresponding outgoing optocoupler and thus physically suppresses the communication forwarding to the bus segment with the first components.

At least the second component connected directly upstream of the bus segment may have a logic facility interposed in the line connection for coupling and decoupling messages from and to the component. The logic facility includes the switch unit and/or the control unit. The switch unit may be implemented as a part of the logic facility, since the already simple structure may be supplemented by a further simple structure. The switch unit may be implemented in a simple implementation (e.g., as an AND gate and/or a NAND gate), with other embodiments that may even include a galvanically isolating switch also being conceivable in principle. In one embodiment, the control unit may be provided as a part of the logic facility, though the generally available interpretation unit for communication messages may be used as the control unit instead.

The logic facility may have a programmable logic module for implementing the control unit and/or the switch unit. While, as already mentioned, a discrete implementation, including the logic facility, may be provided, programmable logic modules may be particularly useful in the context of the present embodiments (e.g., to be able to activate a blocking and release functionality in principle). Conceivable programmable logic modules include, for example, a FPGA and/or a CPLD.

In addition to the magnetic resonance device, the present embodiments also relate to a method for the operation of such a magnetic resonance device. A control unit, upon receiving a blocking signal indicating an active sleep operating mode of first components, causes a switch unit to suppress the communication forwarding to the bus segment. Upon receiving a release signal, the control unit causes the switch unit to release the communication forwarding to the bus segment. All statements relating to the magnetic resonance device may also be applied analogously to the method, and therefore, the advantages already described may thus be provided by the method.

DETAILED DESCRIPTION

Figure 1:
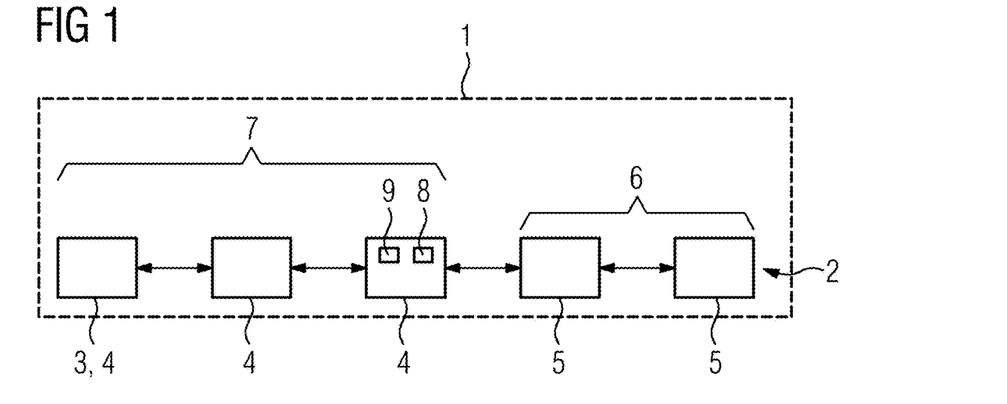
FIG. 1 shows a first embodiment of a serial bus in a magnetic resonance device.

FIG. 1 shows a first possible topology of a serial bus system within a magnetic resonance device 1 (merely indicated here). Within the serial bus system, which may also be a differential serial bus system or an optical serial bus system, five components 3, 4, 5 are connected, for example, via corresponding line connections along a single communication pathway 2 in the present linear topology.

The components 5 are first components 5 that in a normal operating mode may trigger interferences to the image recording operation (e.g., as a result of a free-running clock generator). For this reason, the first components 5 are operable in a normal operating mode as well as in a sleep operating mode, in which, for example, the clock generator is deactivated. This sleep operating mode is to be assumed at least during the period of interference to the image recording operation.

The remaining components 3, 4 form second components 4. The component 3 is a master component 3 that performs overall control of the communication in the serial bus system. Both the first components 5 and the second components 4 are operated in the same serial bus system, which is made possible by the provision of two different measures.

The components 4, 5 are arranged along the communication pathway 2 in sequence such that all first components 5 are grouped together to form a bus segment 6, which may also be described as a sleeping segment, at the end of the communication pathway 2 distant from the master component 3. The bus segment 6 therefore contains no second component 4. Accordingly, the second components 4 form a further bus segment 7 that may also be described as an awake segment.

The second component 4 that is directly adjacent to the bus segment 6 has a switch unit 8 (e.g., a switch) present in a bus interface. The switch unit 8 is configured to interrupt the communication forwarding to the bus segment 6 at the level of the physical signals. The switch unit 8 is actuated by a control unit 9 (e.g., a controller) that is embodied, upon receiving a blocking signal addressed to the corresponding second component 4 from the master component 3, to cause the switch unit 8 to interrupt the communication forwarding and, upon receiving a release signal addressed to the corresponding component 4 from the master component 3, to cause the switch unit 8 to restore the communication forwarding to the bus segment 6.

Figure 2:
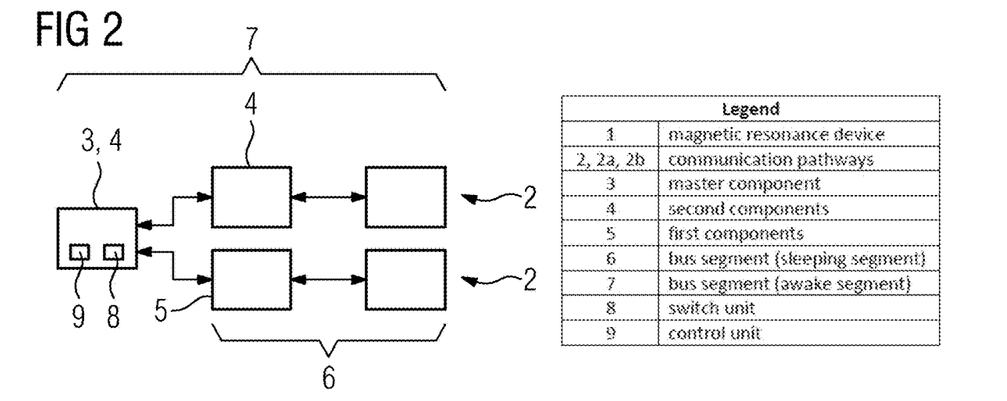
FIG. 2 shows a first alternative topology of the serial bus system.
Figure 3:
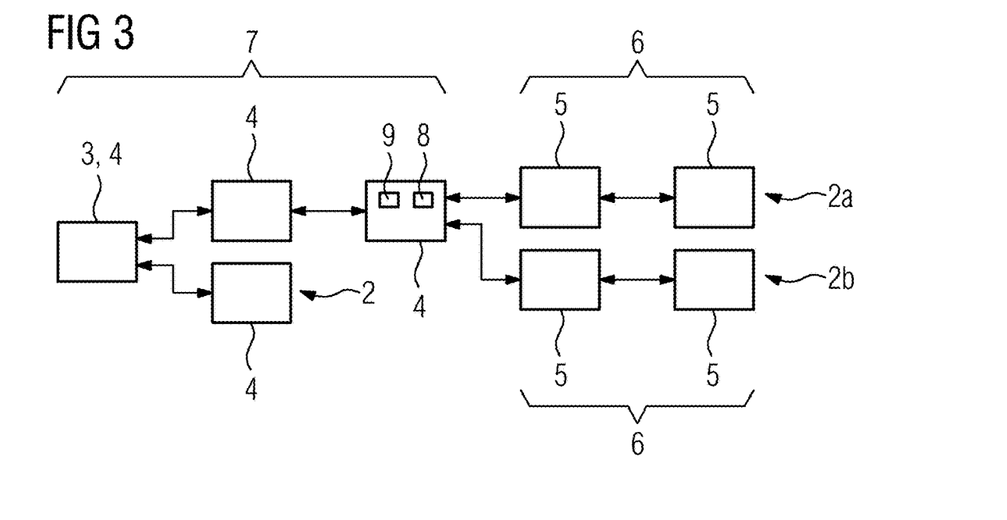
FIG. 3 shows a second alternative topology of the serial bus system.

Topologies of the serial bus system other than that shown in FIG. 1 may also be provided, as indicated, for example, in FIGS. 2 and 3. FIG. 2 shows a possible embodiment of a star topology with two communication pathways 2. The master component 3, 4 has, for example, the switch unit 8 and the control unit 9. In the example in FIG. 3, a combined line-star topology that has three communication pathways 2, 2a, and 2b is provided, so that in addition several bus segments 6 may also be formed.

Figure 4:
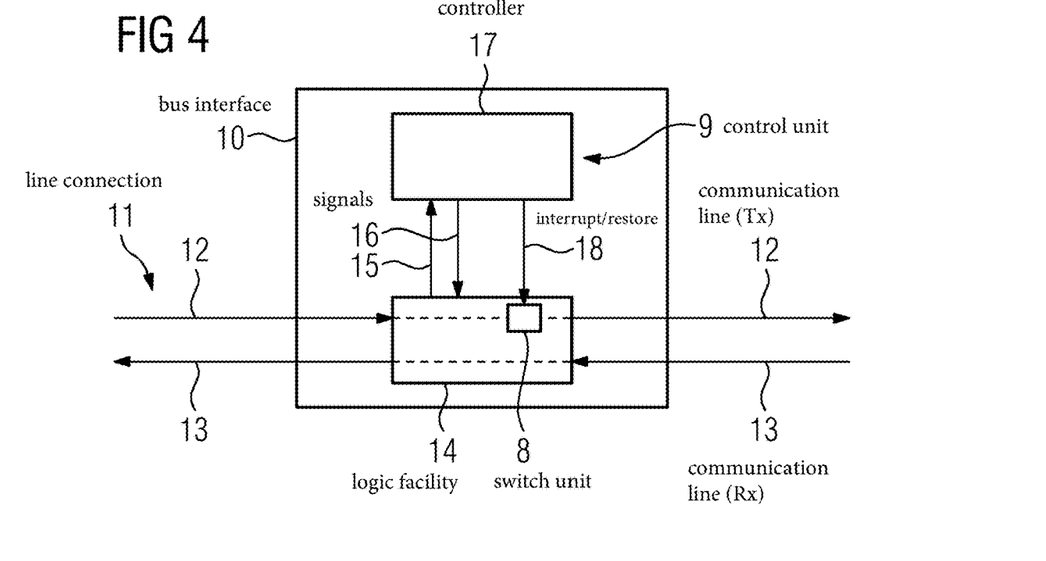
FIG. 4 shows exemplary structure of a bus interface of a second component adjacent to a bus segment of first components.

FIG. 4 shows an exemplary embodiment of a bus interface 10 of a second component 4 adjacent to a bus segment 6 in more detail. The line connection 11 of the communication pathway 2 has, for example, two communication lines 12, 13. The communication line 12 is assigned to the communication direction from the master component 3 toward the bus segment 6 (Tx), and the communication line 13 is assigned to the reverse direction (e.g., toward the master component 3 (Rx)).

The switch unit 8 is implemented as part of a logic facility 14, via which, as indicated by arrows 15, 16, signals and/or communication messages may be forwarded in a processable form to the controller 17. The controller 17 also acts as the control unit 9 here, and output signals intended for the bus may accordingly be fed into the line connection 11.

As is apparent from FIG. 4, the switch unit 8 relates only to the Tx communication line 12 (e.g., to the communication direction toward the bus segment 6). Signals from the bus segment 6 addressed to the master component 3 are forwarded from the bus system 6 to the second components 4 even if the communication forwarding to the bus system 6 is interrupted.

In this way, a first component 5 woken up by an external or internal switch signal independent from the serial bus system may notify this.

While the switch unit 8 may in principle be added as a supplement to a simple, discrete logic module such as an AND module, the logic facility 14 may be embodied, per se, as a programmable logic module (e.g., as an FPGA or CPLD).

The control unit 9 (e.g., in the form of the controller 17) causes the switch unit 8 to interrupt or restore the communication forwarding to the bus segment 6, as shown by the arrow 18. As already mentioned, the communication forwarding is interrupted if a blocking signal is received as a communication message, and the communication forwarding is restored if a release signal is received as a communication message.

Figure 5:
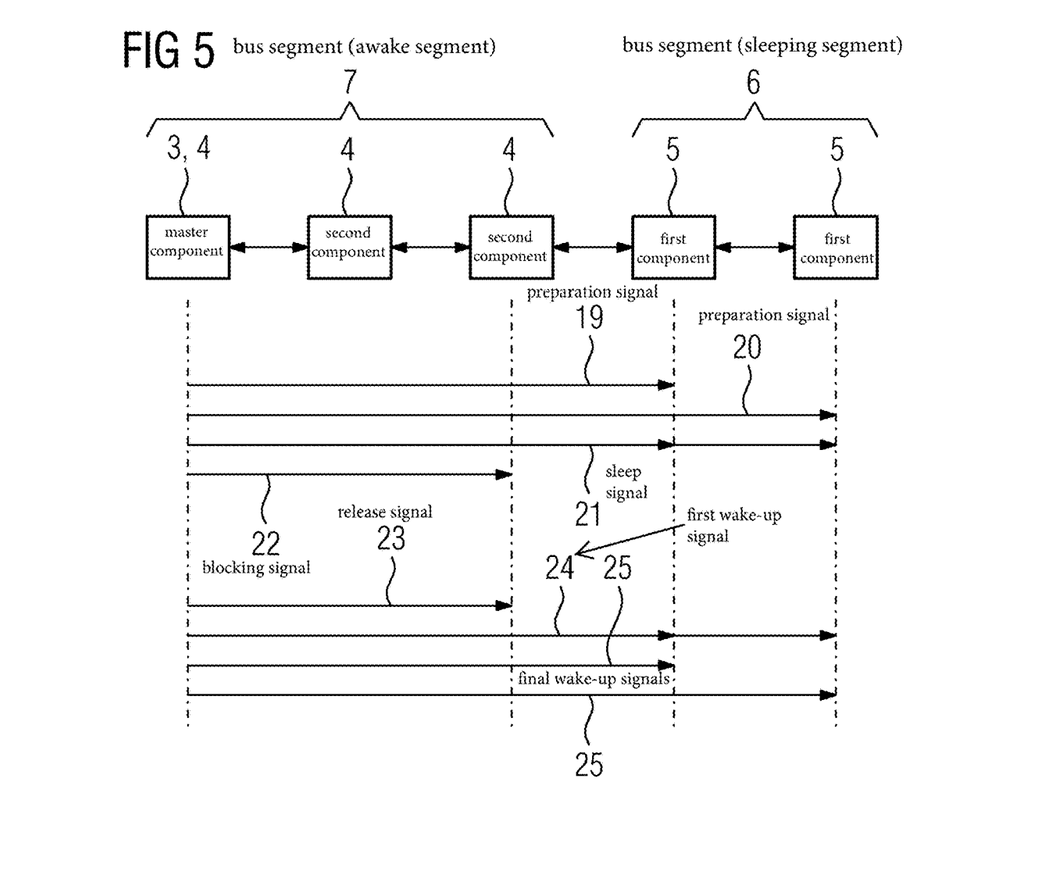
FIG. 5 shows exemplary messages for activating and deactivating a sleep operating mode.

FIG. 5 shows the corresponding communication messages during activation of the sleep operating mode and during deactivation of the sleep operating mode in the example of the topology according to FIG. 1 again in more detail.

To activate the sleep operating mode, the master component 3 initially sends preparation signals 19, 20 to the first components 5 so that the sleep operating mode may be prepared. By a sleep signal 21 of the master component 3, the sleep operating mode is then finally activated in the first components 5.

Following the sleep signal 21, the blocking signal 22 is then sent to the second component 4 connected directly upstream of the bus segment 6, interpreted there via the control unit 9, and used to actuate the switch unit 8 such that the communication forwarding to the bus segment 6 is interrupted.

If the normal operating mode is to be reactivated, the release signal 23 is initially sent to the second component 4 connected directly upstream of the bus segment 6 so that the control unit 9 causes the switch unit 8 to release the communication forwarding to the bus segment 6. Then, a first, arbitrary wake-up signal 24 generating a bus activity may also be forwarded via the first communication line 12 to the first components 5, which detect a bus activity and, initially temporarily, activate the normal operating mode. Within the time span for which the normal operating mode of the first components 5 has been temporarily activated, the final wake-up signals 25 are now transmitted to the first components 5 so that the normal operating mode is activated permanently.

Figure 6:
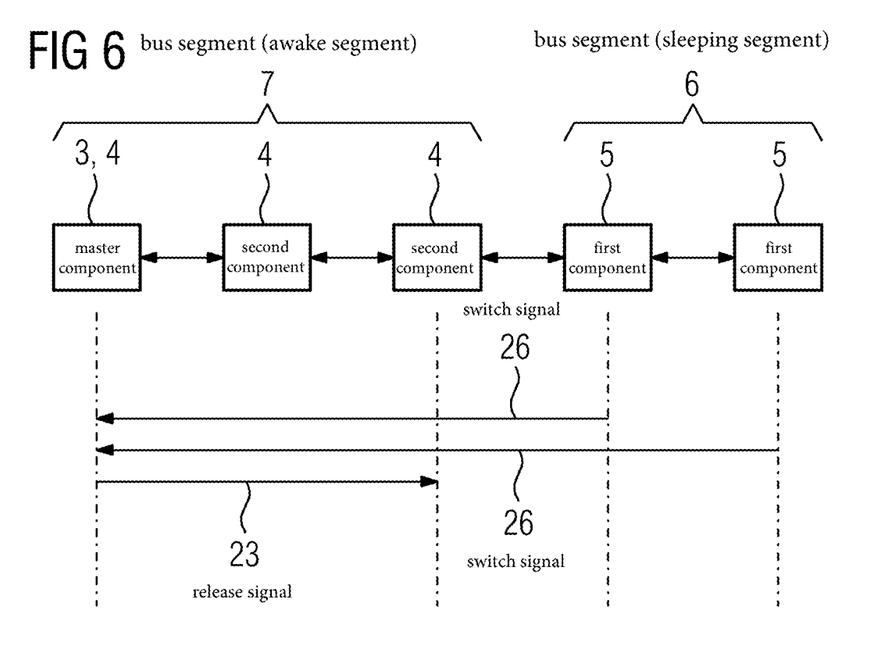
FIG. 6 shows exemplary messages during an external or internal activation of the normal operating mode.

In the case of FIG. 6, the normal operating modes of the first components 5 external to the serial bus system have been reactivated, so that on account of the uninterrupted communication forwarding, these send a switch signal 26 along the communication line 13 to the master component 3. The master component 3 may respond accordingly with a release signal 23 to the second component 4 connected directly upstream of the bus segment 6.

Although the invention has been illustrated and described in detail with the exemplary embodiments, the invention is not restricted by the examples disclosed. Other variations may be derived therefrom by a person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance device to avoid interference, the method comprising:
causing, by a controller, upon receiving a blocking signal indicating an active sleep operating mode of first components of a first bus segment along a communication line of a serial bus system, a switch to prevent any communication forwarding to the first bus segment from a second bus segment along the communication line of the serial bus system; and
causing, by the controller, upon receiving a release signal, the switch to release the communication forwarding to the first bus segment from the second bus segment,
wherein at least one first component of the first components of the first bus segment is operable to emit electromagnetic interference signals during communication forwarding that interfere with an image recording operation of the magnetic resonance device, such that when the first components are in the active sleep operating mode, the electromagnetic interference signals are avoidable.

2. A magnetic resonance device comprising:
a plurality of components comprising:
at least one master component; and
other components communicating with the at least one master component,
wherein in a normal operating mode, at least one first component of the plurality of components that does not correspond to the at least one master component is configured to emit electromagnetic interference signals that interfere with an image recording operation of the magnetic resonance device in at least one interference period,
wherein remaining components of the plurality of components form a group of second components, the at least one first component being operable in the normal operating mode, and in a sleep operating mode, the electromagnetic interference signals being avoidable,
wherein all components of the plurality of components are connected via a serial bus system to the at least one master component via at least one communication pathway realized by a line connection, a first component of the at least one first component in the sleep operating mode being placeable at least temporarily into the normal operating mode upon receiving a communication message via the bus system,
wherein each component of the plurality of components along the at least one communication pathway is arranged such that all first components of the at least one first component are provided at an end of a communication pathway of the at least one communication pathway distant from the at least one master component as a bus segment connected directly downstream of at least one second component of the group of second components and containing exclusively first components of the at least one first component,
wherein at least a second component of the group of second components of each communication pathway of the at least one communication pathway that is provided directly adjacent to the bus segment in the respective communication pathway has a switch for a communication line of the line connection assigned at least to a communication direction toward the bus segment and a controller, and
wherein the controller is configured to:
cause the switch to suppress communication forwarding to the bus segment upon receiving a blocking signal indicating an active sleep operating mode of the at least one first component; and
cause the switch to release the communication forwarding to the bus segment upon receiving a release signal.

3. The magnetic resonance device of claim 2, wherein the line connection has two communication lines assigned in each case to a communication direction, and
wherein an interruption of the communication forwarding affects only a direction toward the bus segment.

4. The magnetic resonance device of claim 3, wherein the at least one master component is configured, upon receiving from the first component via an uninterrupted communication line of the two communication lines a switch signal indicating a switch to the normal operating mode triggered outside of the serial bus system, to emit a release signal, at least when the switch signal fulfills a relevance criterion.

5. The magnetic resonance device of claim 2, wherein the at least one master component is configured to generate the blocking signal and the release signal addressed to the second component connected directly upstream of the bus segment.

6. The magnetic resonance device of claim 2, wherein the at least one master component is configured to:
activate the sleep operating mode for all first components of the at least one first component, the activation of the sleep operating mode comprising emission of at least one sleep signal activating the sleep operating mode to all first components of the at least one first component followed by the blocking signal;
activation of the normal operating mode, the activation of the normal operating mode comprising emission of the release signal followed by at least one wake-up signal activating the normal operating mode to all first components of the at least one first component; or
a combination thereof.

7. The magnetic resonance device of claim 6, wherein the controller is further configured to generate at least one preparation signal as a further sleep signal or a further wake-up signal in addition to the sleep signal, the wake-up signal, or the sleep signal and the wake-up signal finally activating the respectively desired operating mode.

8. The magnetic resonance device of claim 2, wherein the line connection is configured for optical signal transmission.

9. The magnetic resonance device of claim 2, wherein at least the second component connected directly upstream of the bus system has a logic facility interposed in the line connection for coupling and decoupling messages from and to the second component, and
wherein the logic facility comprises the switch, the controller, or the switch and the controller.

10. The magnetic resonance device of claim 9, wherein the logic facility has a programmable logic module for implementing the controller, the switch, or the controller and the switch.

11. The magnetic resonance device of claim 4, wherein the at least one master component is configured to generate the blocking signal and the release signal addressed to the second component connected directly upstream of the bus segment.

12. The magnetic resonance device of claim 4, wherein the at least one master component is configured to:
activate the sleep operating mode for all first components of the at least one first component, the activation of the sleep operating mode comprising emission of at least one sleep signal activating the sleep operating mode to all first components of the at least one first component followed by the blocking signal;

activation of the normal operating mode, the activation of the normal operating mode comprising emission of the release signal followed by at least one wake-up signal activating the normal operating mode to all first components of the at least one first component; or a combination thereof.

13. The magnetic resonance device of claim 12, wherein the controller is further configured to generate at least one preparation signal as a further sleep signal or a further wake-up signal in addition to the sleep signal, the wake-up signal, or the sleep signal and the wake-up signal finally activating the sleep operating mode or the normal operating mode.

14. The magnetic resonance device of claim 4, wherein the line connection is configured for optical signal transmission.

15. The magnetic resonance device of claim 4, wherein at least the second component connected directly upstream of the bus system has a logic facility interposed in the line connection for coupling and decoupling messages from and to the second component, and wherein the logic facility comprises the switch, the controller, or the switch and the controller.

16. The magnetic resonance device of claim 15, wherein the logic facility has a programmable logic module for implementing the controller, the switch, or the controller and the switch.

17. A magnetic resonance device comprising:

a first bus segment along a communication line of a serial bus system, the first bus segment comprising a first set of components; and a second bus segment in communication with the first bus segment along the communication line of the serial bus system, the second bus segment comprising a second set of components, wherein at least one component of the second set of components comprises a switch and a controller, wherein at least one component of the first set of components is operable to emit electromagnetic interference signals during communication with the second bus segment that interfere with an image recording operation of the magnetic resonance device, such that when the first set of components are in a sleep operating mode, the electromagnetic interference signals are avoidable, and wherein the controller is configured to:

cause the switch to prevent any communication to the first bus segment from the second bus segment along the communication line of the serial bus system upon receiving a blocking signal indicating the first set of components are in the sleep operating mode; and cause the switch to allow communication to the first bus segment from the second bus segment upon receiving a release signal.

* * * * *